United States Patent
Feng et al.

(10) Patent No.: US 9,183,340 B2
(45) Date of Patent: *Nov. 10, 2015

(54) ELECTRONIC DEVICE HAVING CIRCUIT BOARD WITH CO-LAYOUT DESIGN OF MULTIPLE CONNECTOR PLACEMENT SITES AND RELATED CIRCUIT BOARD THEREOF

(71) Applicant: MEDIATEK INC., Hsin-Chu (TW)

(72) Inventors: Huai-Yuan Feng, Hsinchu County (TW); Ching-Gu Pan, Hsinchu (TW); Yan-Bin Luo, Taipei (TW); Hua Wu, Hsinchu County (TW); Shang-Yi Lin, Hsinchu County (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/158,876

(22) Filed: Jan. 20, 2014

(65) Prior Publication Data

US 2014/0137065 A1   May 15, 2014

Related U.S. Application Data

(63) Continuation of application No. 13/041,442, filed on Mar. 7, 2011, now Pat. No. 8,665,606.

(60) Provisional application No. 61/364,926, filed on Jul. 16, 2010.

(51) Int. Cl.
| | |
|---|---|
| *H05K 1/11* | (2006.01) |
| *H05K 1/14* | (2006.01) |
| *G06F 17/50* | (2006.01) |
| *H05K 1/02* | (2006.01) |

(52) U.S. Cl.
CPC .......... *G06F 17/5072* (2013.01); *H05K 1/0295* (2013.01); *H05K 1/029* (2013.01); *H05K 2201/09954* (2013.01); *H05K 2201/10189* (2013.01); *H05K 2201/10689* (2013.01)

(58) Field of Classification Search
CPC .. G06F 17/5072; H05K 1/029; H05K 1/0295; H05K 2201/09954; H05K 2201/10189; H05K 2201/10689
USPC ......... 361/784, 748, 760, 761, 764, 803, 778; 701/36, 38, 1, 11, 301, 100, 305, 316, 701/230, 255, 515
See application file for complete search history.

(56) References Cited

U.S. PATENT DOCUMENTS

| | | | | |
|---|---|---|---|---|
| 5,996,029 A * | 11/1999 | Sugiyama et al. | ............... | 710/15 |
| 7,941,053 B2 * | 5/2011 | Dallesasse | .................... | 398/139 |
| 8,665,606 B2 * | 3/2014 | Feng et al. | .................... | 361/784 |
| 2007/0038794 A1 * | 2/2007 | Purcell et al. | ................. | 710/306 |
| 2008/0059685 A1 * | 3/2008 | Hsu et al. | ...................... | 710/314 |
| 2011/0015523 A1 * | 1/2011 | Sabata | .......................... | 600/443 |

* cited by examiner

*Primary Examiner* — Yuriy Semenenko
(74) *Attorney, Agent, or Firm* — Winston Hsu; Scott Margo

(57) ABSTRACT

An electronic device includes an integrated circuit, a connector, and a circuit board. The integrated circuit includes a first signal processing circuit, a second signal processing circuit, and an interface multiplexer having a first input port electrically connected to the first signal processing circuit, a second input port electrically connected to the second signal processing circuit, and an output port arranged to be electrically connected to the first input port or the second input port. The circuit board carries the integrated circuit and has a plurality of connector placement sites, including at least a first connector placement site each dedicated to the first signal processing circuit and at least a second connector placement site each dedicated to the second signal processing circuit. The connector placement sites and the output port of the interface multiplexer are electrically connected in series. The connector is installed on one of the connector placement sites.

8 Claims, 14 Drawing Sheets

ELECTRONIC DEVICE HAVING CIRCUIT BOARD WITH CO-LAYOUT DESIGN OF MULTIPLE CONNECTOR PLACEMENT SITES AND RELATED CIRCUIT BOARD THEREOF

CROSS REFERENCE TO RELATED APPLICATIONS

This application is a continuation application and claims the benefit of U.S. application Ser. No. 13/041,442, which was filed on Mar. 7, 2011, and entitled "ELECTRONIC DEVICE HAVING CIRCUIT BOARD WITH CO-LAYOUT DESIGN OF MULTIPLE CONNECTOR PLACEMENT SITES AND RELATED CIRCUIT BOARD THEREOF". In addition, the aforementioned U.S. application Ser. No. 13/041,442 claims the benefit of U.S. Provisional Application No. 61/364,926, filed on Jul. 16, 2010 and incorporated herein by reference.

BACKGROUND

The disclosed embodiments of the present invention relate to a layout design of a circuit board, and more particularly, to an electronic device having a circuit board with a co-layout design of multiple connector placement sites and related circuit board thereof.

In a conventional video processing system, certain functional blocks are implemented in different chips. For example, a scaler is integrated in one chip, and a timing controller (T-CON) is integrated in another chip. Therefore, the output interfaces (i.e., connectors) of the scaler and the timing controller are also separate, which increases the production cost inevitably.

Recently, integrating the scaler and the timing controller into a single chip is getting more and more popular. Therefore, there is a need for an innovation layout design of the circuit board which carries the single chip with the scaler and the timing controller both integrated therein.

SUMMARY

In accordance with exemplary embodiments of the present invention, an electronic device having a circuit board with a co-layout design of multiple connector placement sites and related circuit board thereof are proposed to solve the above-mentioned problem.

According to a first aspect of the present invention, an exemplary electronic device is disclosed. The exemplary electronic device includes an integrated circuit, a connector, and a circuit board. The integrated circuit includes a first signal processing circuit, a second signal processing circuit, and an interface multiplexer having a first input port electrically connected to the first signal processing circuit, a second input port electrically connected to the second signal processing circuit, and an output port arranged to be electrically connected to the first input port or the second input port. The circuit board carries the integrated circuit and has a plurality of connector placement sites, including at least a first connector placement site each dedicated to the first signal processing circuit and at least a second connector placement site each dedicated to the second signal processing circuit. The connector placement sites and the output port of the interface multiplexer are electrically connected in series. The connector is installed on one of the connector placement sites.

According to a second aspect of the present invention, an exemplary electronic device is disclosed. The exemplary electronic device includes an integrated circuit, a circuit board, and a connector. The integrated circuit includes a first signal processing circuit, a second signal processing circuit, and an interface multiplexer having a first input port electrically connected to the first signal processing circuit, a second input port electrically connected to the second signal processing circuit, and an output port arranged to be electrically connected to the first input port or the second input port. The circuit board carries the integrated circuit, and has a plurality of connector placement sites, at least a group of passive component placement sites, and a plurality of signal traces. The connector placement sites includes at least a first connector placement site each dedicated to one of the first and second signal processing circuits and at least a second connector placement site each dedicated to the other of the first and second signal processing circuits. The group of passive component placement sites is disposed between the first and second connector placement sites and has no passive component installed thereon. The signal traces include first signal traces making the first connector placement site and the output port electrically connected in series, second signal traces making the first connector placement site and the passive component placement sites electrically connected in series, and third signal traces making the second connector placement site and the passive component placement sites electrically connected in series. The connector is installed on the first connector placement site.

According to a third aspect of the present invention, an exemplary circuit board is disclosed. The exemplary circuit board includes an integrated circuit placement site, a plurality of connector placement sites, and a plurality of signal traces. The connector placement sites include a first connector placement site and a second connector placement site corresponding to different connector types, respectively. The signal traces include first signal traces electrically connected between the integrated circuit placement site and the first connector placement site and second signal traces electrically connected between the first and second connector placement sites, wherein the integrated circuit placement site and the first and second connector placement sites are electrically connected in series through the first and second signal traces.

According to a fourth aspect of the present invention, an exemplary circuit board is disposed. The exemplary circuit board includes an integrated circuit placement site, a plurality of connector placement sites, at least a group of passive component placement sites, and a plurality of signal traces. The connector placement sites include a first connector placement site and a second connector placement site corresponding to different connector types, respectively. The group of passive component placement sites is disposed between the first connector placement site and the second connector placement site. The signal traces include first signal traces electrically connected between the integrated circuit placement site and the first connector placement site, second signal traces electrically connected between the group of passive component placement sites and the first connector placement site, and third signal traces electrically connected between the group of passive component placement sites and the second connector placement site.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple/electrically connect" is intended to mean either an indirect or direct electrical connection. Accordingly, if one device is coupled to another device, that connection may be through a direct electrical connection, or through an indirect electrical connection via other devices and connections.

The conception of the present invention is to have multiple connector placement sites defined on the same circuit board (e.g., a printed circuit board) and dedicated to the same chip with multiple signal processing circuits integrated therein. Based on which one of the signal processing circuits that is selected to be used, a connector corresponding to the selected signal processing circuit is installed on one of the connector placement sites defined on the circuit board. In a case where another signal processing circuit is required to be selected and used, the circuit board with the same layout design of the connector placement sites can be employed for allowing a connector corresponding to the selected signal processing circuit to be installed on another one of the connector placement sites defined on the circuit board. To put it simply, the proposed circuit board layout is capable of meeting the requirements of different applications, thereby increasing the flexibility in the use of the circuit board. Further details are discussed as follows.

Figure 1:
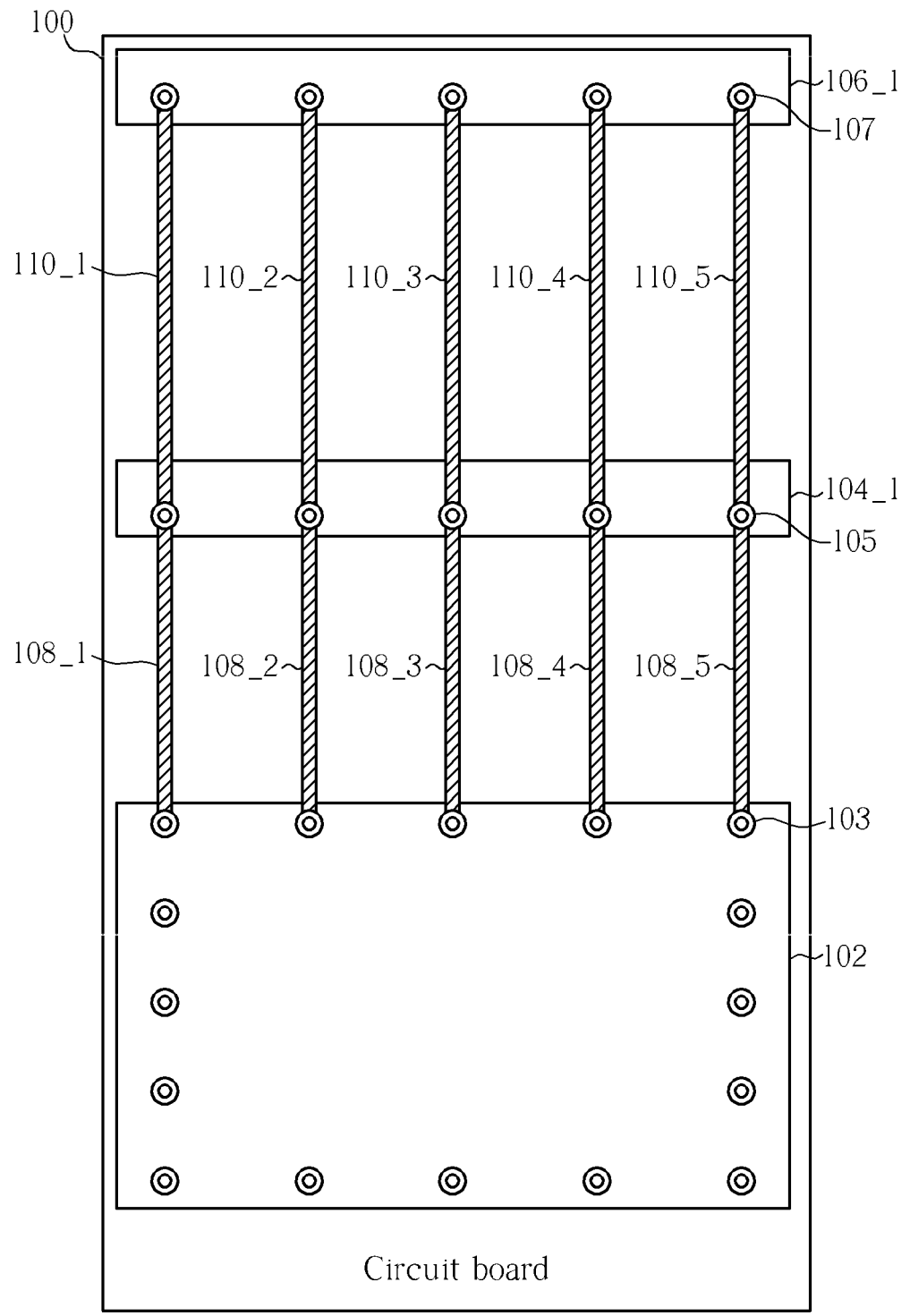
FIG. 1 is a block diagram illustrating a first exemplary layout design of a circuit board according to the present invention.

Please refer to FIG. 1, which is a block diagram illustrating a first exemplary layout design of a circuit board according to the present invention. The circuit board (e.g., a printed circuit board) 100 has an integrated circuit placement site 102, a plurality of connector placement sites including at least a first connector placement site 104_1 and at least a second connector placement site 106_1, and a plurality of signal traces including first signal traces 108_1-108_5 and second signal traces 110_1-110_5. The integrated circuit placement site 102 has a plurality of connection nodes 103, such as pads or plated through holes (vias). Similarly, the first connector placement site 104_1 has a plurality of connection nodes 105, such as plated through holes (vias); and the second connector placement site 106_1 has a plurality of connection nodes 107, such as plated through holes (vias). The first signal traces 108_1-108_5 are electrically connected between the integrated circuit placement site 102 and the first connector placement site 104_1, and the second signal traces 110_1-110_5 are electrically connected between the first connector placement site 104_1 and the second connector placement site 106_1. As can be seen from FIG. 1, the integrated circuit placement site 102, the first connector placement site 104_1, and the second connector placement site 106_1 are electrically connected in series through the first signal traces 108_1-108_5 and second signal traces 110_1-110_5. It should noted that the number of connector placement sites shown in FIG. 1 and the number of signal traces shown in FIG. 1 are for illustrative purposes only, and are not meant to be limitations of the present invention.

The integrated circuit placement site 102 is defined to allow an integrated circuit (i.e., a chip) to be installed thereon, and the connector placement sites, including the first connector placement site 104_1 and the second connector placement site 106_1, are defined to allow a connector with a specific connector type to be installed on one of the connector placement sites. By way of example, but not limitation, the first connector placement site 104_1 and the second connector placement site 106_1 correspond to different connector types (i.e., different interface types). For instance, the connector installed on the first connector placement site 104_1/second connector placement site 106_1 may be a mini-LVDS (mini Low Voltage Differential Signal) interface, an EPI (Embedded Point-Point Interface) interface, a PPML (Point to Point mini-LVDS) interface, an Advanced PPML interface, a CalDriCon (Calibration Driver Controller) interface, an LVDS (Low Voltage Differential Signal) interface, a V-by-One interface, or an iDP (Internal DisplayPort) interface, depending upon actual design requirement.

Figure 2:
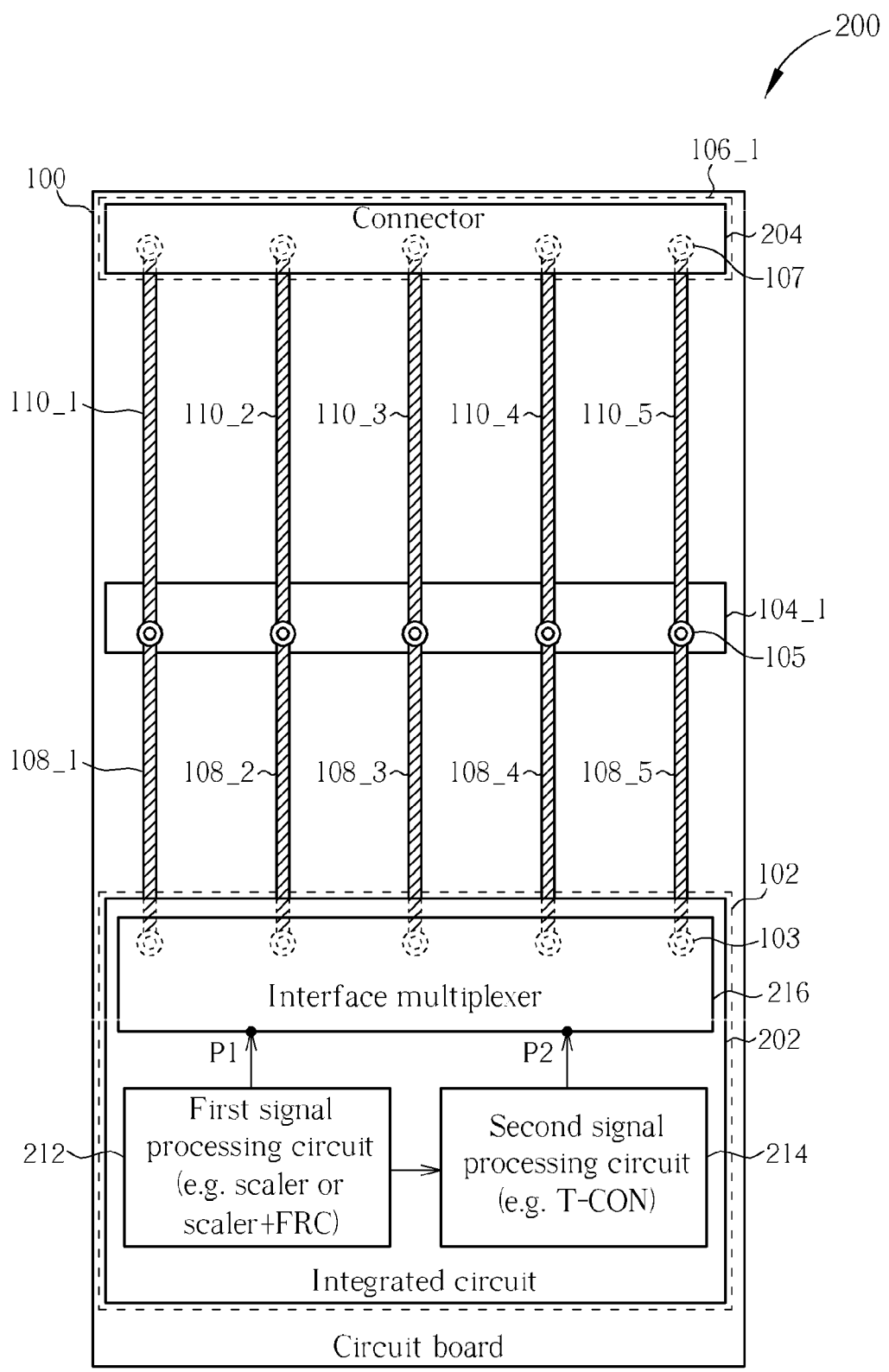
FIG. 2 is a block diagram illustrating a first exemplary electronic device employing the circuit board shown in FIG. 1 according to the present invention.

Please refer to FIG. 2, which is a block diagram illustrating a first exemplary electronic device employing the circuit board 100 shown in FIG. 1 according to the present invention. The exemplary electronic device 200 includes, but is not limited to, an integrated circuit 202, the circuit board 100 shown in FIG. 1, and a connector 204. The integrated circuit 202 may be a system-on-a-chip (SOC) installed on the integrated circuit placement site 102 defined on the circuit board 100, and includes, but is not limited to, a first signal processing circuit 212, a second signal processing circuit 214, and an interface multiplexer 216. The first signal processing circuit 212 and the second signal processing circuit 214 are arranged to perform different signal processing operations. For example, the first signal processing circuit 212 may be a scaler for processing video data to be displayed, or may include a scaler for processing video data to be displayed and a frame-rate conversion (FRC) circuit for adjusting the frame rate of an input video stream to a different frame rate. Regarding the second signal processing circuit 214, it may be a timing controller (T-CON) used to drive a display panel, such as a liquid crystal display (LCD) panel, according to an output of the first signal processing circuit 212. As a person skilled in the art can readily understand operations and functions of the scaler, the FRC circuit, and the timing controller, further description is omitted here for brevity.

The interface multiplexer 216 has a first input port P1 electrically connected to the first signal processing circuit 212, a second input port P2 electrically connected to the second signal processing circuit 214, and an output port arranged to be electrically connected to the first input port P1 or the second input port P2. In this exemplary embodiment, the output port may be simply represented by certain connection nodes (plated through holes or pads) 103 to which the interface multiplexer 216 is electrically connected.

In this exemplary embodiment, the first connector placement site 104_1 is dedicated to the first signal processing circuit 212, and the second connector placement site 106_1 is dedicated to the second signal processing circuit 214. That is, if a connector is installed on the first connector placement site 104_1, the installed connector would act as an output interface of the first signal processing circuit 212. Similarly, if a connector is installed on the second connector placement site 106_1, the installed connector would act as an output interface of the second signal processing circuit 214.

In a case where a particular application employs the internal timing controller (i.e., the second signal processing circuit 214) implemented in the integrated circuit 202 for driving an external display panel (not shown), the interface multiplexer 216 would be controlled to have its output port electrically connected to the second port P2, thereby allowing the output of the second signal processing circuit 214 to be transmitted from the integrated circuit 202 to the external display panel. To meet the requirement of the particular application, the connector 204 is installed on the second connector placement site 106_1 dedicated to the second processing circuit 214. In this way, with a proper cable connection between the connector 204 and the external display panel, the output of the second signal processing circuit 214 is transmitted from the integrated circuit 202 to the external display panel. It should be noted that the first connector placement site 104_1 has no connector installed thereon in this case.

In another case where a particular application employs an external timing controller, instead of the internal timing controller (i.e., the second signal processing circuit 214) implemented in the integrated circuit 202, for driving an external display panel (not shown), the interface multiplexer 216 would be controlled to have its output port electrically connected to the first port P1, thereby allowing the output of the first signal processing circuit 212 to be transmitted from the integrated circuit 202 to the external timing controller for further processing. Please refer to FIG. 3, which is a block diagram illustrating a second exemplary electronic device employing the circuit board shown in FIG. 1 according to the present invention. To meet the requirement of the particular application, the connector 304 is installed on the first connector placement site 104_1 dedicated to the first signal processing circuit 212. In this way, with a proper cable connection between the connector 304 and the external timing controller which may be installed on another circuit board, the output of the first signal processing circuit 212 is transmitted from the integrated circuit 202 to the external timing controller. It should be noted that the second connector placement site 106_1 has no connector installed thereon in this case.

Figure 4:
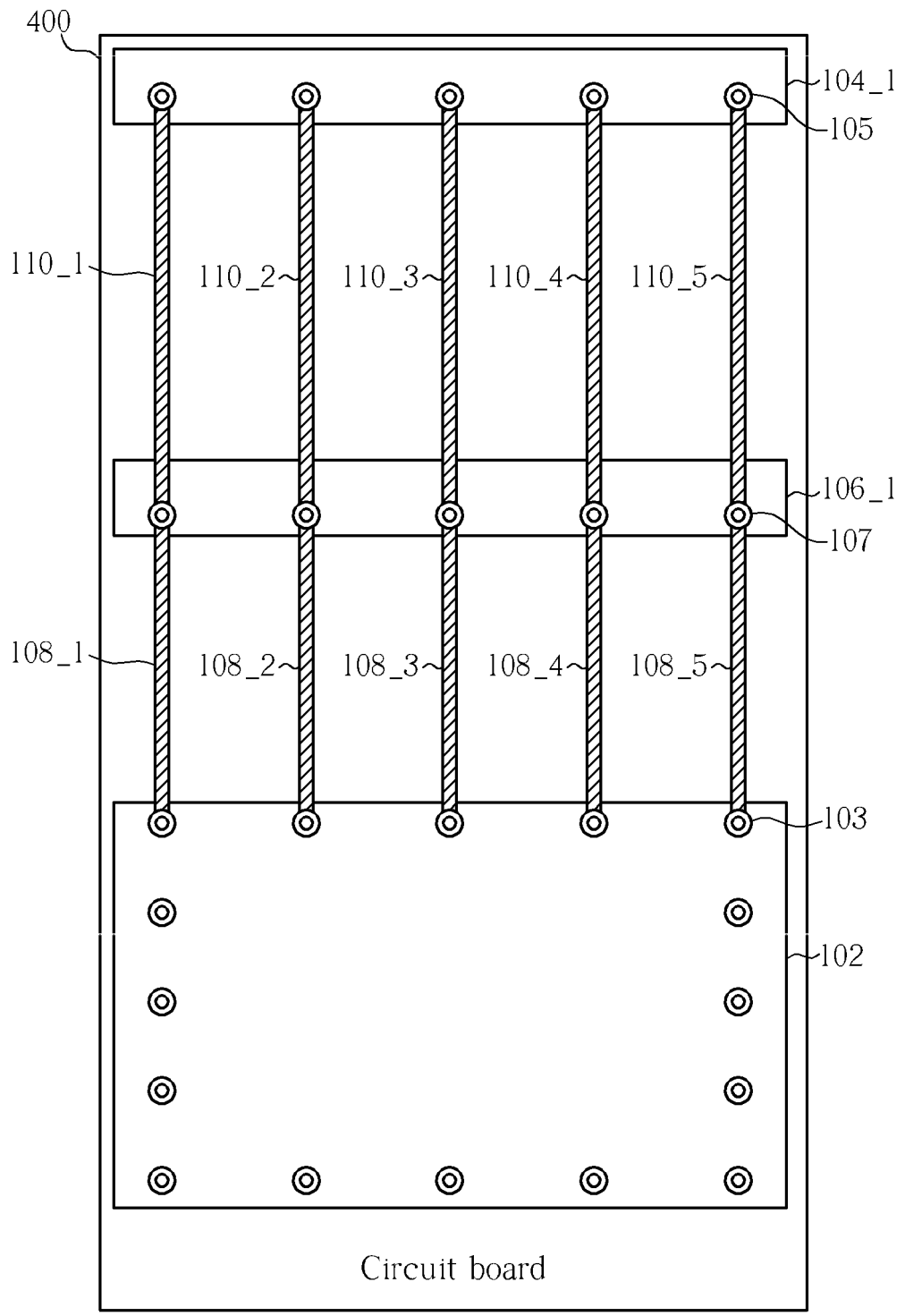
FIG. 4 is a block diagram illustrating a second exemplary layout design of a circuit board according to the present invention.

In above exemplary embodiments, the first connector placement site 104_1 dedicated to the first signal processing circuit 212 is closer to the integrated circuit 202 than the second connector placement site 106_1 dedicated to the second signal processing circuit 214. However, this is for illustrative purposes only. In an alternative design, the second connector placement site 106_1 may be closer to the integrated circuit 202 than the first connector placement site 104_1. FIG. 4 is a block diagram illustrating a second exemplary layout design of a circuit board according to the present invention. The exemplary circuit board 400 has a layout design similar to that of the exemplary circuit board 100 shown in FIG. 1. The major difference between them is that the second connector placement site 106_1 dedicated to the second signal processing circuit 214 is closer to the integrated circuit placement site 102 than the first connector placement site 104_1 dedicated to the first signal processing circuit 212.

Figure 5:
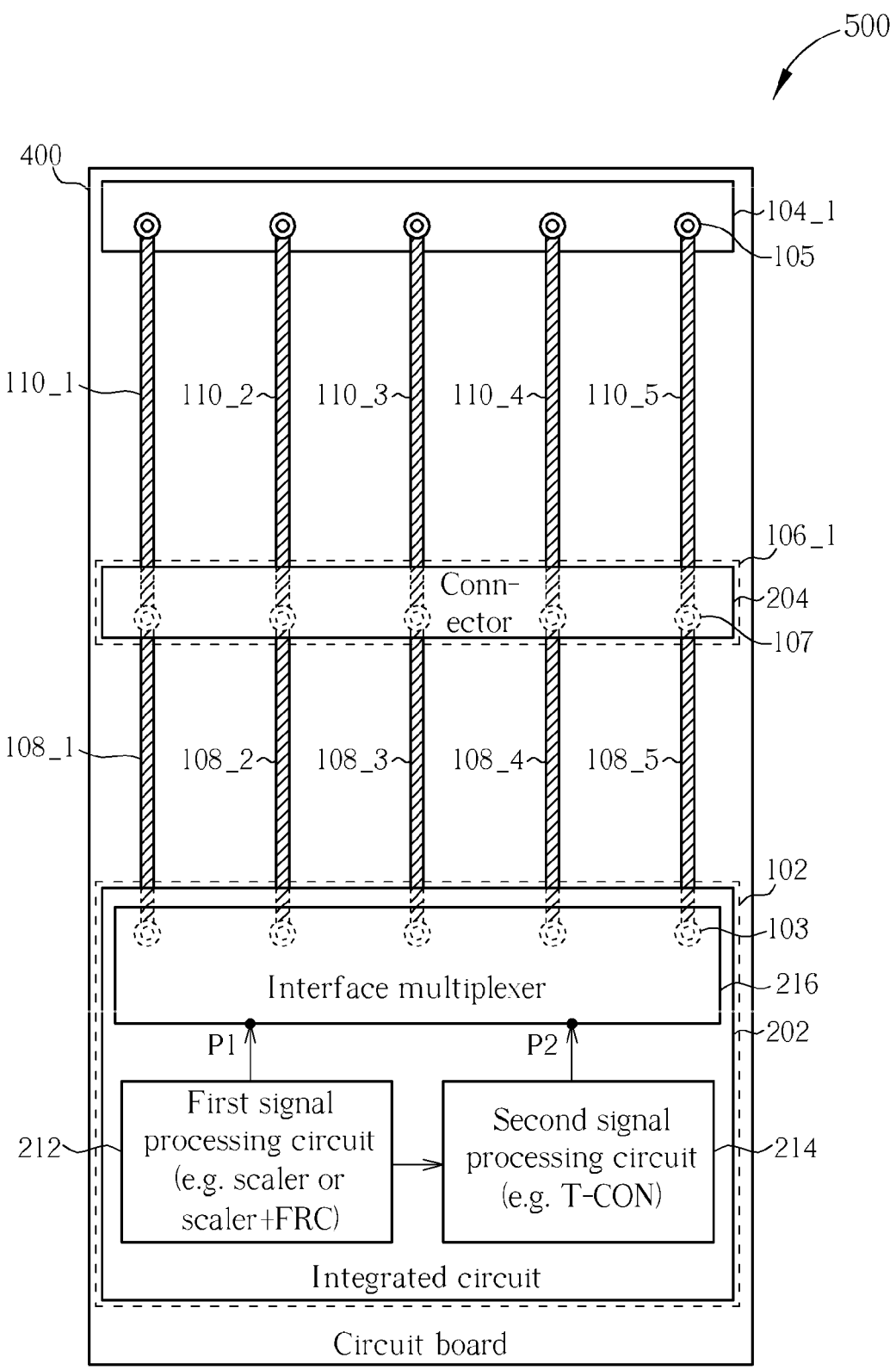
FIG. 5 is a block diagram illustrating a first exemplary electronic device employing the circuit board shown in FIG. 4 according to the present invention.
Figure 6:
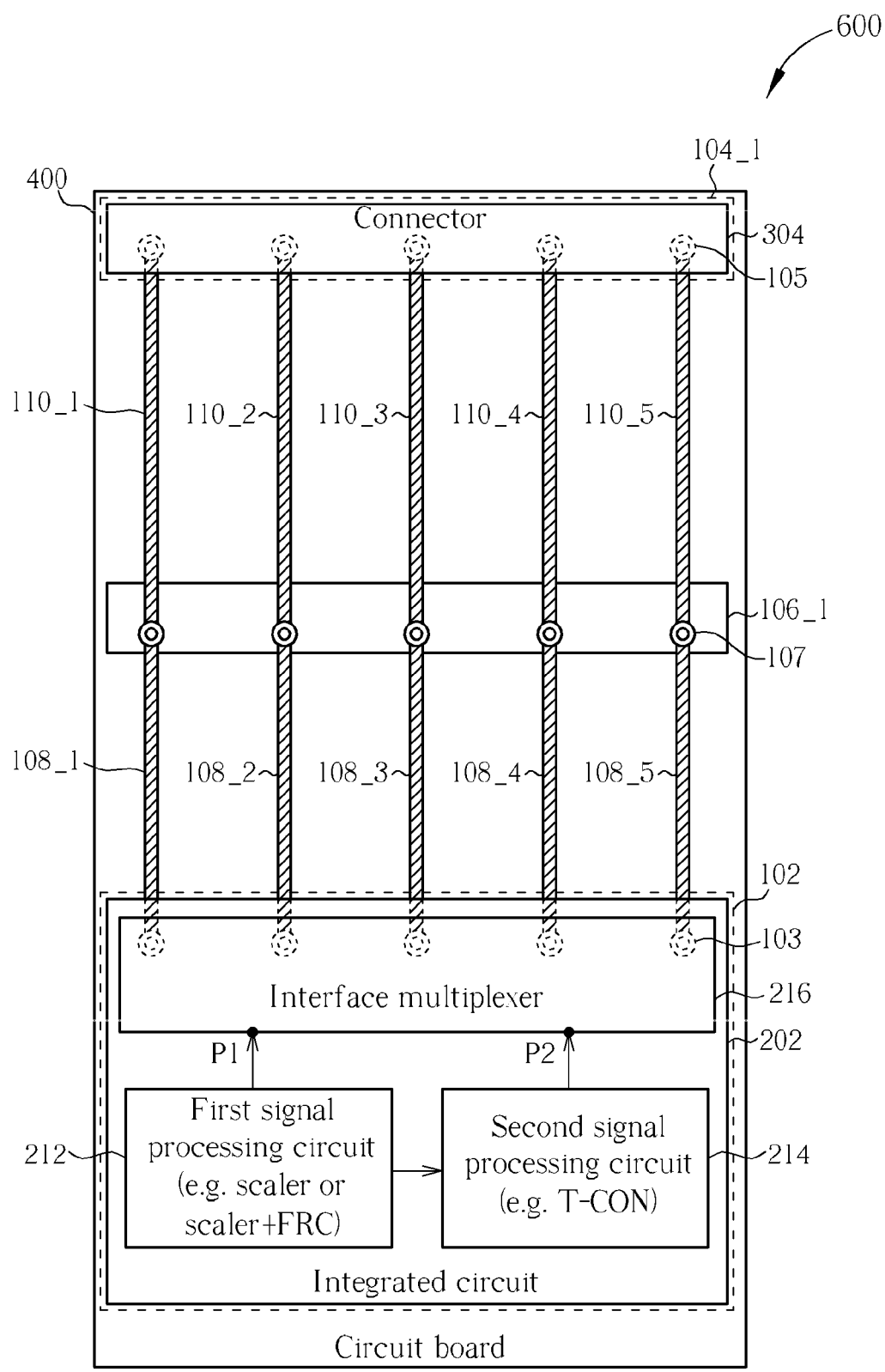
FIG. 6 is a block diagram illustrating a second exemplary electronic device employing the circuit board shown in FIG. 4 according to the present invention.

Please refer to FIG. 5 and FIG. 6 in conjunction with FIG. 4. FIG. 5 is a block diagram illustrating a first exemplary electronic device employing the circuit board 400 shown in FIG. 4 according to the present invention. FIG. 6 is a block diagram illustrating a second exemplary electronic device employing the circuit board 400 shown in FIG. 4 according to the present invention. In a case where a particular application employs the internal timing controller (i.e., the second signal processing circuit 214) implemented in the integrated circuit 202 for driving an external display panel (not shown), the interface multiplexer 216 of the exemplary electronic device 500 would be controlled to have its output port electrically connected to the second port P2, and the connector 204 is installed on the second connector placement site 106_1 dedicated to the second processing circuit 214. In another case where a particular application employs an external timing controller, instead of the internal timing controller (i.e., the second signal processing circuit 214) implemented in the integrated circuit 202, for driving an external display panel (not shown), the interface multiplexer 216 of the exemplary electronic device 600 would be controlled to have its output port electrically connected to the first port P1, and the connector 304 is installed on the first connector placement site 104_1 dedicated to the first signal processing circuit 212.

Figure 7:
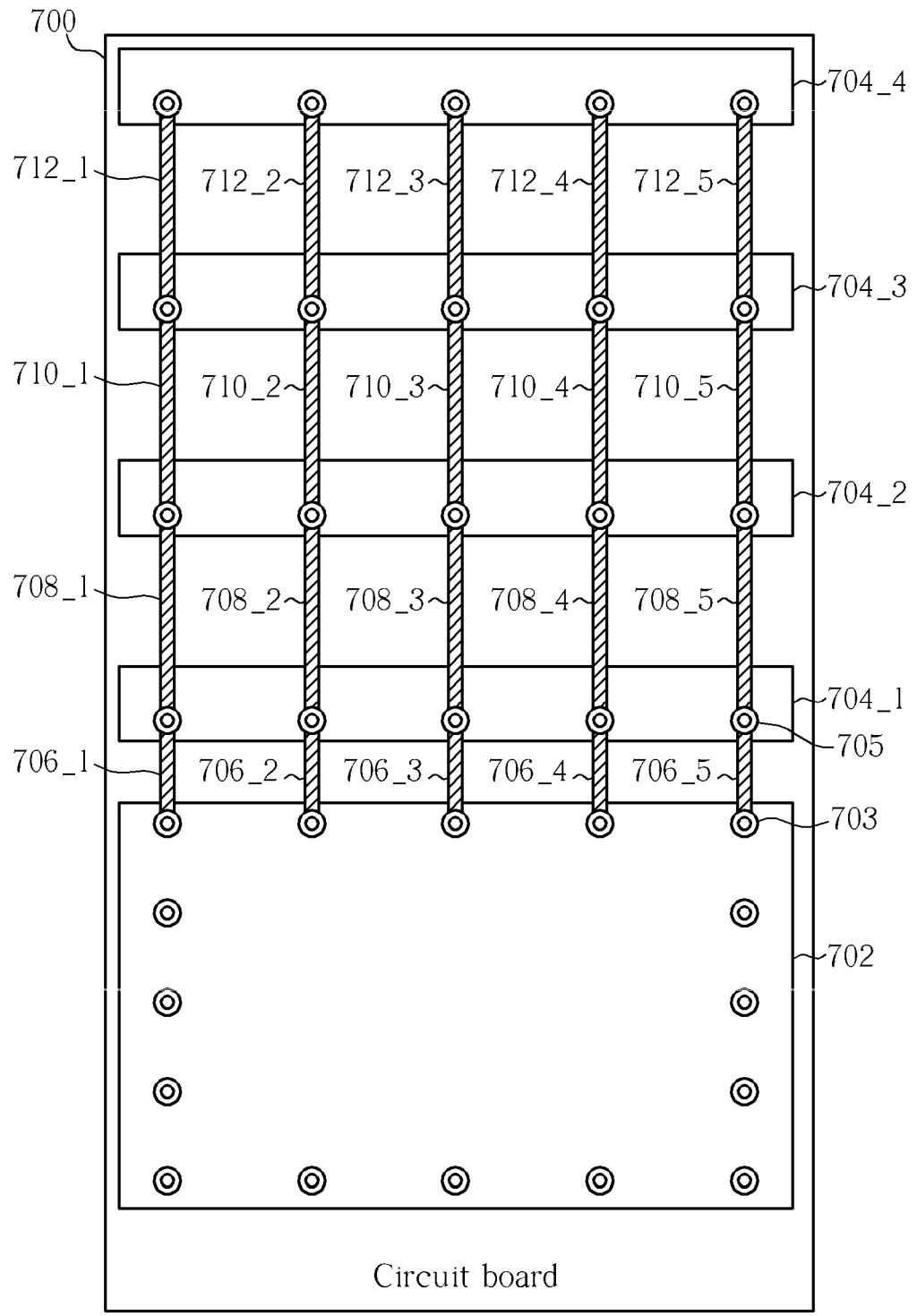
FIG. 7 is a block diagram illustrating a third exemplary layout design of a circuit board according to the present invention.

Regarding the layout design of each circuit board 100/400, only one connector placement site dedicated to the first signal processing circuit 212 and only one connector placement site dedicated to the second signal processing circuit 214 are defined on the circuit board 100/400. However, this is for illustrative purposes only, and is not meant to be a limitation of the present invention. FIG. 7 is a block diagram illustrating a third exemplary layout design of a circuit board according to the present invention. The circuit board (e.g., a printed circuit board) 700 has an integrated circuit placement site 702, a plurality of connector placement sites 704_1-704_4, and a plurality of signal traces including first signal traces 706_1-706_5 electrically connected between the integrated circuit placement site 702 and the connector placement site 704_1, second signal traces 708_1-708_5 electrically connected between connector placement sites 704_1 and 704_2, third signal traces 710_1-710_5 electrically connected between connector placement sites 704_2 and 704_3, and fourth signal traces 712_1-712_5 electrically connected between connector placement sites 704_3 and 704_4. The integrated circuit placement site 702 has a plurality of connection nodes 703, such as pads or plated through holes (vias). Similarly, each of the connector placement sites 704_1-704_4 has a plurality of connection nodes 705, such as plated through holes (vias). As can be seen from FIG. 7, the integrated circuit placement site 702 and the connector placement sites 704_1-704_4 are electrically connected in series through the first signal traces 706_1-706_5, the second signal traces 708_1-708_5, the third signal traces 710_1-710_5, and the fourth signal traces 712_1-712_5.

It should be noted that the connector placement sites 704_1-704_4 include more than one connector placement site dedicated to at least one of the first signal processing circuit 212 and the second signal processing circuit 214. By way of example, but not limitation, the connector placement sites 704_1-704_2 are both dedicated to the first signal processing circuit 212 but correspond to different connector types (i.e., different interface types), and the connector placement sites 704_3-704_4 are both dedicated to the second signal processing circuit 214 but correspond to different connector types (i.e., different interface types). As the circuit board 700 supports more connector types for either of the first signal processing circuit 212 and the second signal processing circuit 214, the flexibility in the use of the circuit board 700 can be improved greatly. That is, with a target connector properly installed on one of the connector placement sites 704_1-704_4 defined by the circuit board layout design, a resultant electronic device employing the circuit board 700 to carry the integrated circuit 202 can meet the requirement of a particular application.

In an alternative design, the connector placement sites 704_1-704_2 may be both dedicated to the second signal processing circuit 214 but correspond to different connector types, and the connector placement sites 704_3-704_4 may be both dedicated to the first signal processing circuit 212 but correspond to different connector types. The similar objective of supporting more connector types for either of the first signal processing circuit 212 and the second signal processing circuit 214 is achieved.

In yet alternative design, one of the connector placement sites 704_1-704_4 is dedicated to one of the first signal processing circuit 212 and the second signal processing circuit 214, and the remaining connector placement sites are all dedicated to the other of the first signal processing circuit 212 and the second signal processing circuit 214 but correspond to different connector types. The similar objective of supporting more connector types for one of the first signal processing circuit 212 and the second signal processing circuit 214 is achieved.

Moreover, as a person skilled in the art can readily understand details of possible electronic devices each employing the circuit board 700 shown in FIG. 7 after reading the above paragraphs directed to the exemplary electronic devices 200, 300, 500, and 600, further description is omitted here for brevity.

Figure 3:
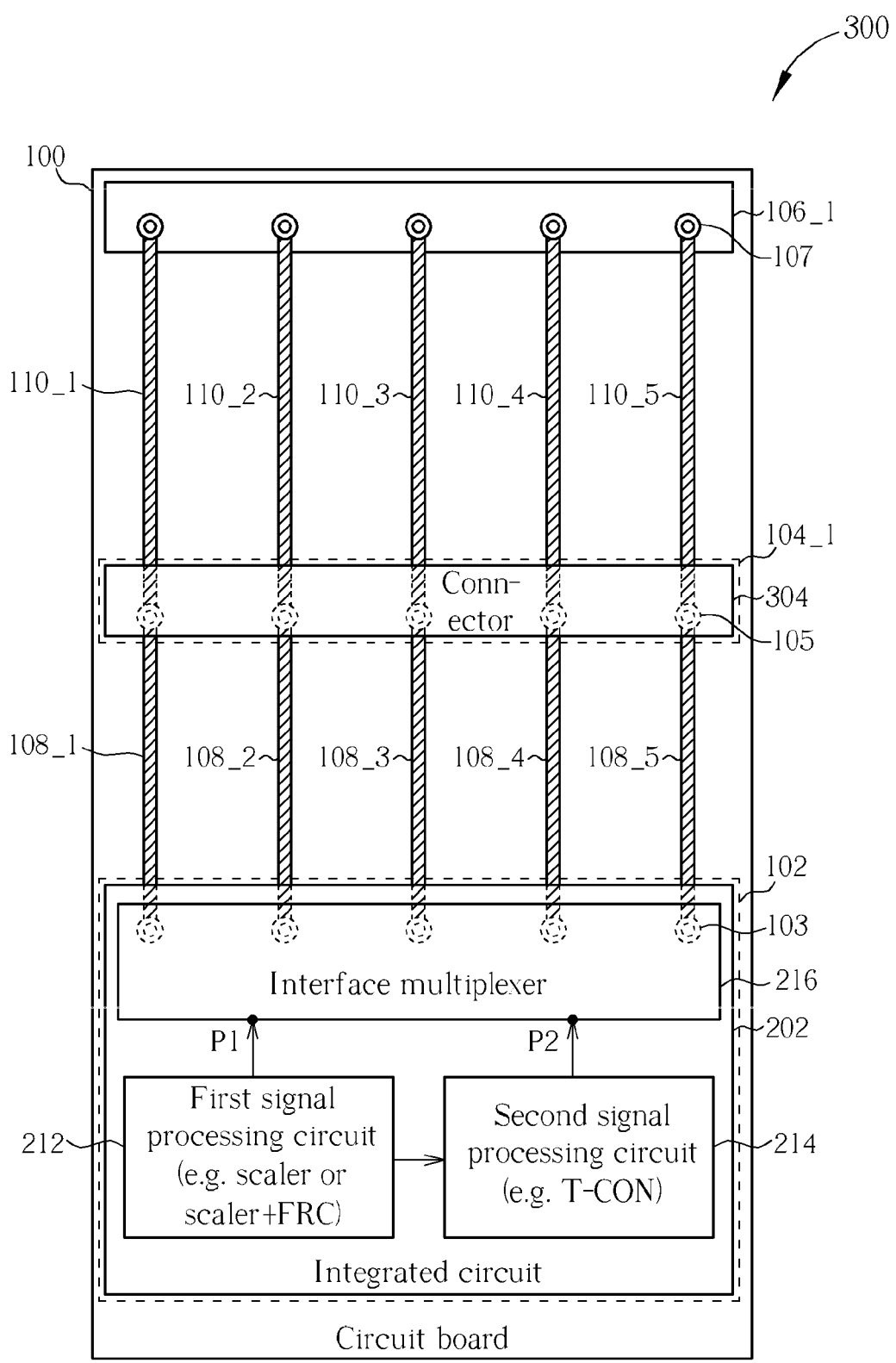
FIG. 3 is a block diagram illustrating a second exemplary electronic device employing the circuit board shown in FIG. 1 according to the present invention.

As shown in FIG. 3, the connector 304 is installed on the first connector placement site 104_1 closer to the integrated circuit 202 than the second connector placement site 106_1, and the second connector placement site 106_1 has no connector installed thereon. When the first signal processing circuit 212 is generating an output to an external processing circuit (e.g., an external timing controller) through the connector 304, the outer second connector placement site 106_1 is electrically connected to the inner first connector placement site 104_1 through the second traces 110_1-110_5. Thus, the second connector placement site 106_1, which is not used for connector installation but is electrically connected to the first connector placement site 104_1 with the connector 304 installed thereon, may degrade the signal transmission quality of the output of the first signal processing circuit 212. Similarly, regarding the exemplary embodiment shown in FIG. 5, the connector 204 is installed on the second connector placement site 106_1 closer to the integrated circuit 202 than the first connector placement site 104_1, and the first connector placement site 104_1 has no connector installed thereon. When the second signal processing circuit 214 is generating an output to an external apparatus (e.g., an external display panel) through the connector 204, the outer first connector placement site 104_1 is electrically connected to the inner second connector placement site 106_1 through the second traces 110_1-110_5. The first connector placement site 104_1, which is not used for connector installation but is electrically connected to the second connector placement site 106_1 with the connector 204 installed thereon, may degrade the signal transmission quality of the output of the second signal processing circuit 214. The present invention therefore proposed an improved circuit board layout design to prevent the undesired signal degradation.

Figure 8:
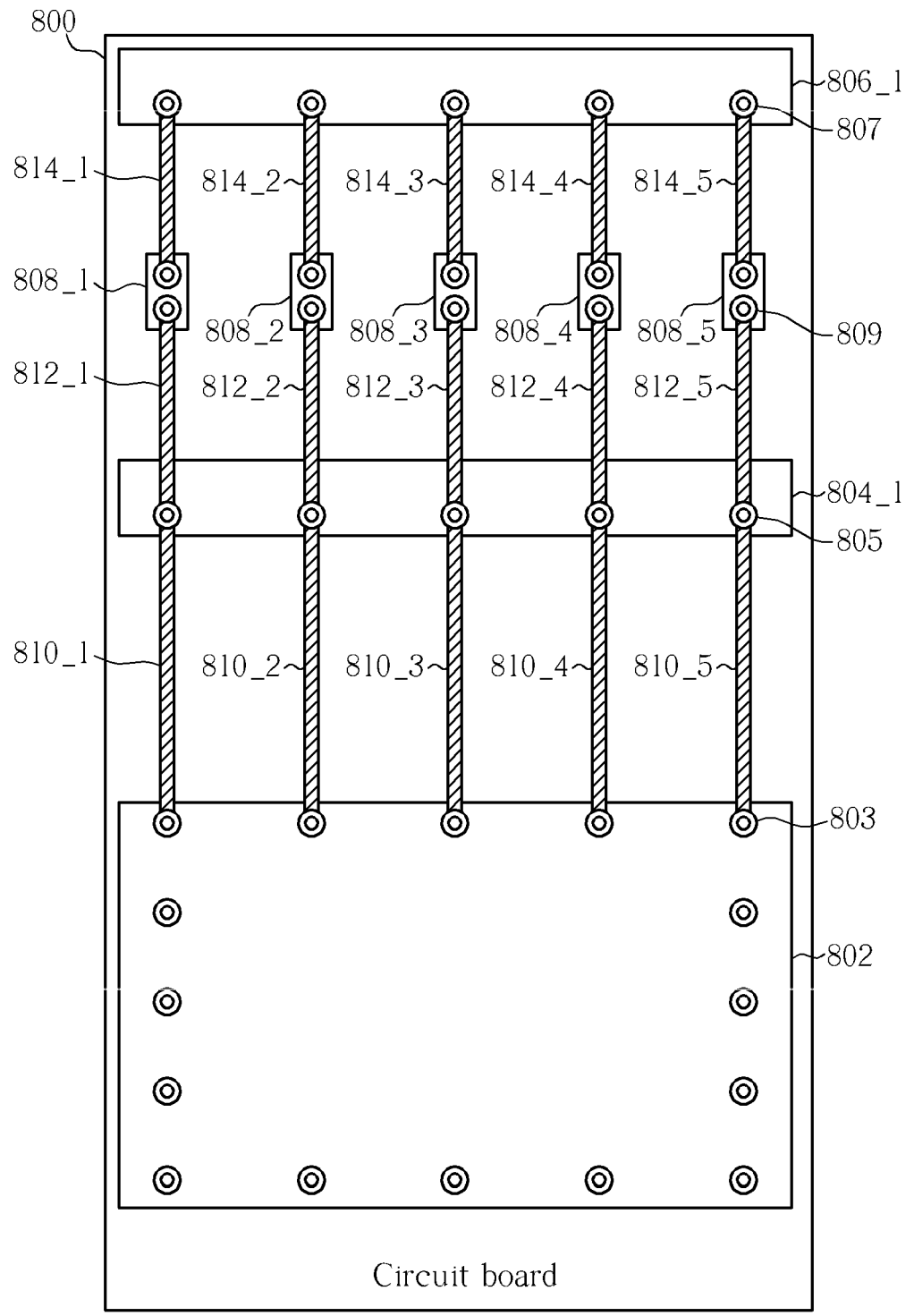
FIG. 8 is a block diagram illustrating a fourth exemplary layout design of a circuit board according to the present invention.

Please refer to FIG. 8, which is a block diagram illustrating a fourth exemplary layout design of a circuit board according to the present invention. The circuit board (e.g., a printed circuit board) 800 has an integrated circuit placement site 802, a plurality of connector placement sites including at least a first connector placement site 804_1 and at least a second connector placement site 806_1, at least a group of passive component placement sites 808_1-808_5 disposed between the first connector placement site 804_1 and the second connector placement site 806_1, and a plurality of signal traces including first signal traces 810_1-810_5, second signal traces 812_1-812_5, and third signal traces 814_1-814_5. The integrated circuit placement site 802 has a plurality of connection nodes 803, such as pads or plated through holes (vias). Similarly, the first connector placement site 804_1 has a plurality of connection nodes 805, such as plated through holes (vias); the second connector placement site 806_1 has a plurality of connection nodes 807, such as plated through holes (vias); and each of the passive component placement sites 808_1-808_5 has a plurality of connection nodes 809, such as plated through holes (vias). As shown in FIG. 8, the first signal traces 810_1-810_5 are electrically connected between the integrated circuit placement site 802 and the first connector placement site 804_1, the second signal traces 812_1-812_5 are electrically connected between the first connector placement site 804_1 and the group of passive component placement sites 808_1-808_5, and the third signal traces 814_1-814_5 are electrically connected between the group of passive component placement sites 808_1-808_5 and the second connector placement site 806_1. It should noted that the number of connector placement sites shown in FIG. 8, the number of signal traces shown in FIG. 8, and the number of passive component placement sites shown in FIG. 8 are for illustrative purposes only, and are not meant to be limitations of the present invention.

The function of the integrated circuit placement site 802 is identical to that of the integrated circuit placement site 102, and the function of the connector placement sites, including the first connector placement site 804_1 and the second connector placement site 806_1, is identical to that of the connector placement sites, including the first connector placement site 104_1 and the second connector placement site 106_1. Further description is omitted here for brevity. Regarding each of the passive placement sites 808_1-808_5, it is defied to allow a passive component, such as a zero-ohm resistor, to be installed thereon.

Figure 9:
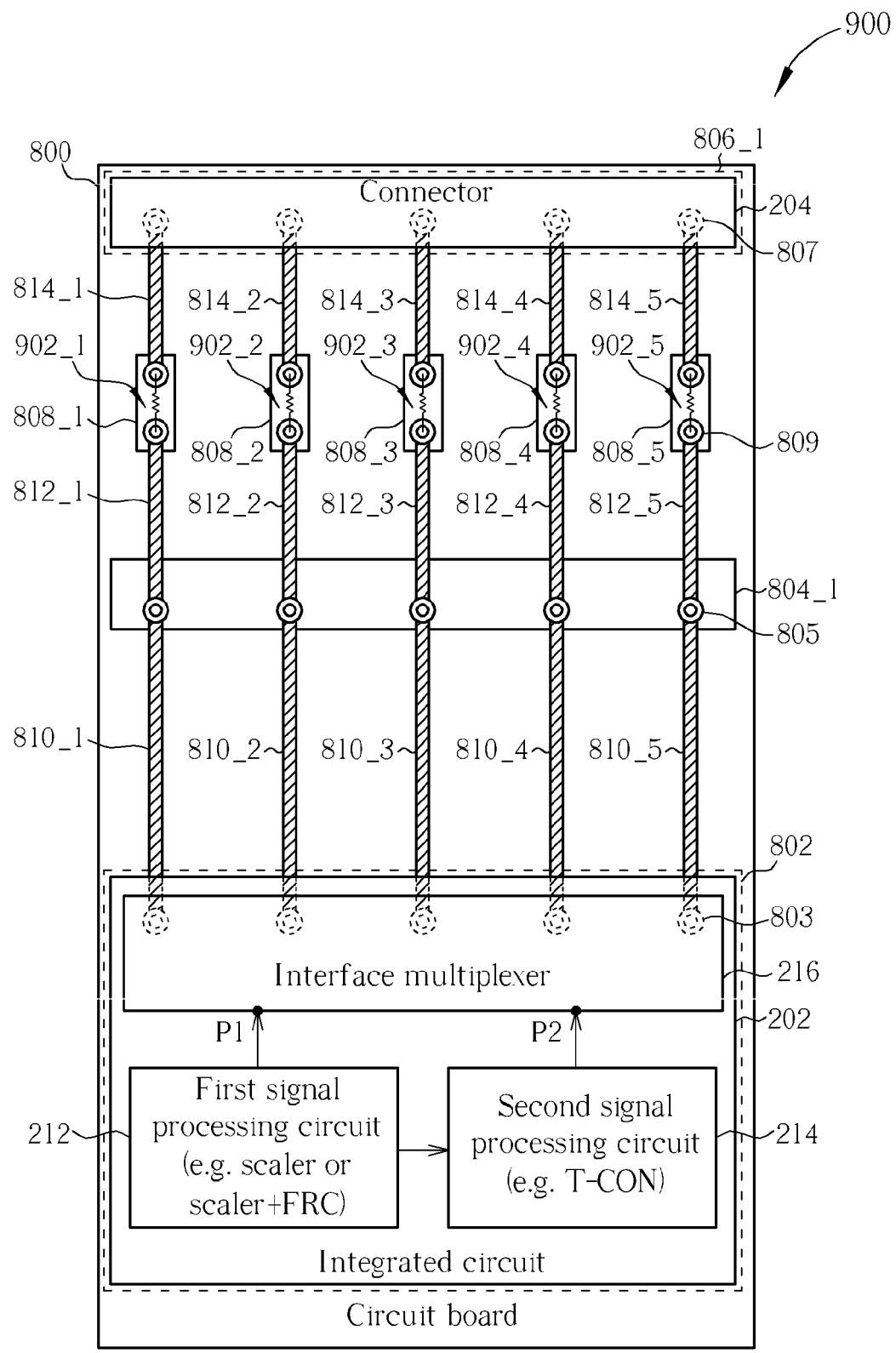
FIG. 9 is a block diagram illustrating a first exemplary electronic device employing the circuit board shown in FIG. 8 according to the present invention.

Please refer to FIG. 9, which is a block diagram illustrating a first exemplary electronic device employing the circuit board 800 shown in FIG. 8 according to the present invention. The exemplary electronic device 900 includes, but is not limited to, the integrated circuit 202, the circuit board 800 shown in FIG. 8, the connector 204 installed on the second connector placement site 806_1, and a plurality of passive components 902_1-902_5 (e.g., zero-ohm resistors) respectively installed on the passive component placement sites 808_1-808_5. In this exemplary embodiment, the first connector placement site 804_1 is dedicated to the first signal processing circuit 212, and the second connector placement site 806_1 is dedicated to the second signal processing circuit 214. In a case where a particular application employs the internal timing controller (i.e., the second signal processing circuit 214) implemented in the integrated circuit 202 for driving an external display panel (not shown), the interface multiplexer 216 would be controlled to have its output port electrically connected to the second port P2. Therefore, the connector 204 is installed on the second connector placement site 806_1 dedicated to the second processing circuit 214 for allowing the signal transmission between the second signal processing circuit 214 and the external display panel. The configuration of the exemplary electronic device 900 shown in FIG. 9 is similar to that of the exemplary electronic device 200 shown in FIG. 2. The major difference between them is that the second connector placement site 806_1, the first connector placement site 804_1, and the integrated circuit placement site 802 are electrically connected in series through the first signal traces 810_1-810_5, the second signal traces 812_1-812_5, the installed passive components 902_1-902_5, and the third signal traces 814_1-814_5.

In another case where a particular application employs an external timing controller, instead of the internal timing controller (i.e., the second signal processing circuit 214) implemented in the integrated circuit 202, for driving an external display panel, the interface multiplexer 216 would be controlled to have its output port electrically connected to the first port P1, thereby allowing the output of the first signal processing circuit 212 to be transmitted from the integrated circuit 202 to the external timing controller (not shown). Please refer to FIG. 10, which is a block diagram illustrating a second exemplary electronic device employing the circuit board 800 shown in FIG. 8 according to the present invention. To meet the requirement of the particular application, the connector 304 is installed on the first connector placement site 804_1 dedicated to the first processing circuit 212. It should be noted that the passive component placement sites 808_1-808_5 have no passive component installed thereon. In other words, each of the passive component placement sites 808_1-808_5 acts as an open circuit. In this way, the second connector placement site 806_1 would be isolated from the first connector placement site 804_1 on which the connector 304 is installed, thereby avoiding the undesired signal degradation caused by the second connector placement site 806_1.

Figure 10:
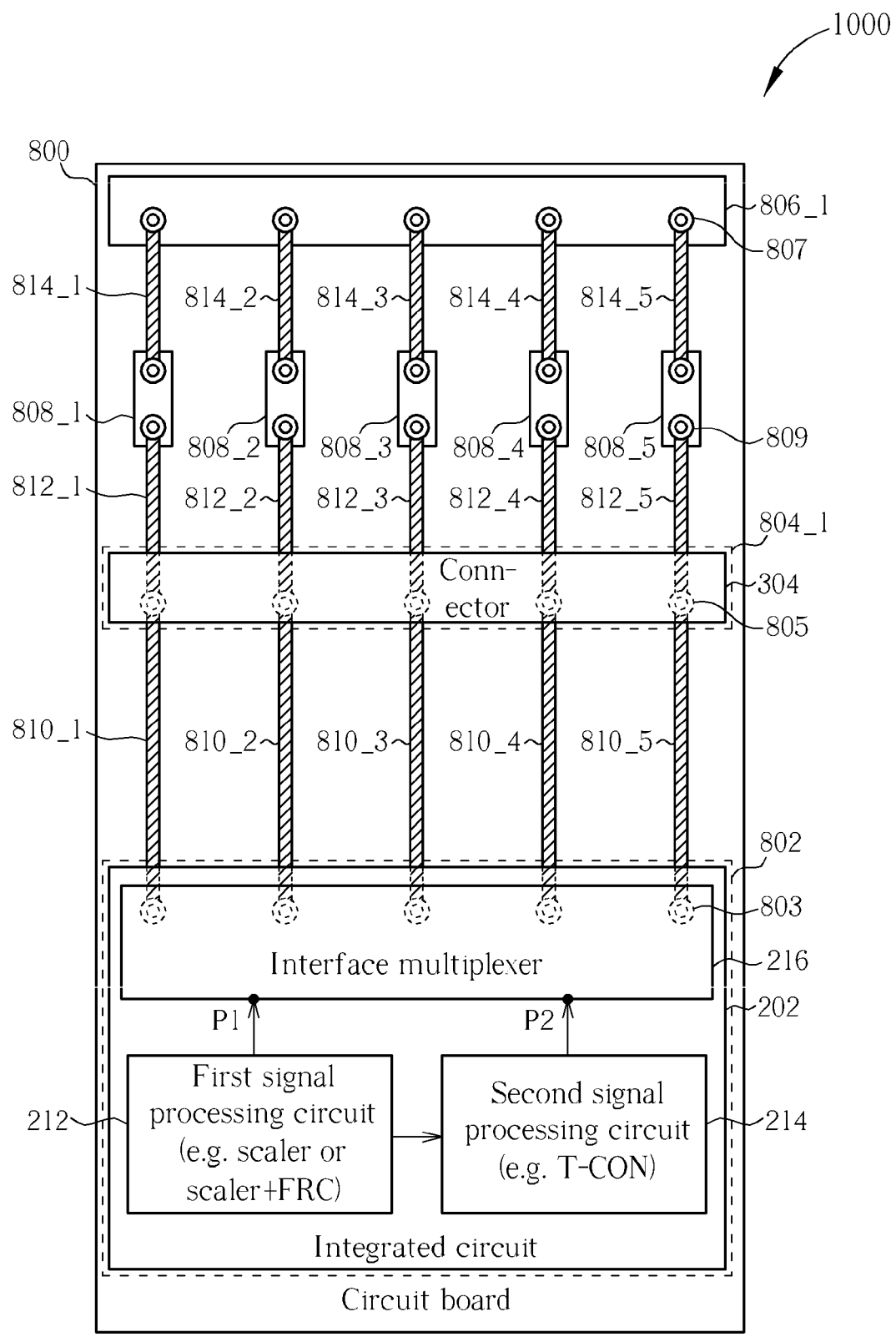
FIG. 10 is a block diagram illustrating a second exemplary electronic device employing the circuit board shown in FIG. 8 according to the present invention.
Figure 11:
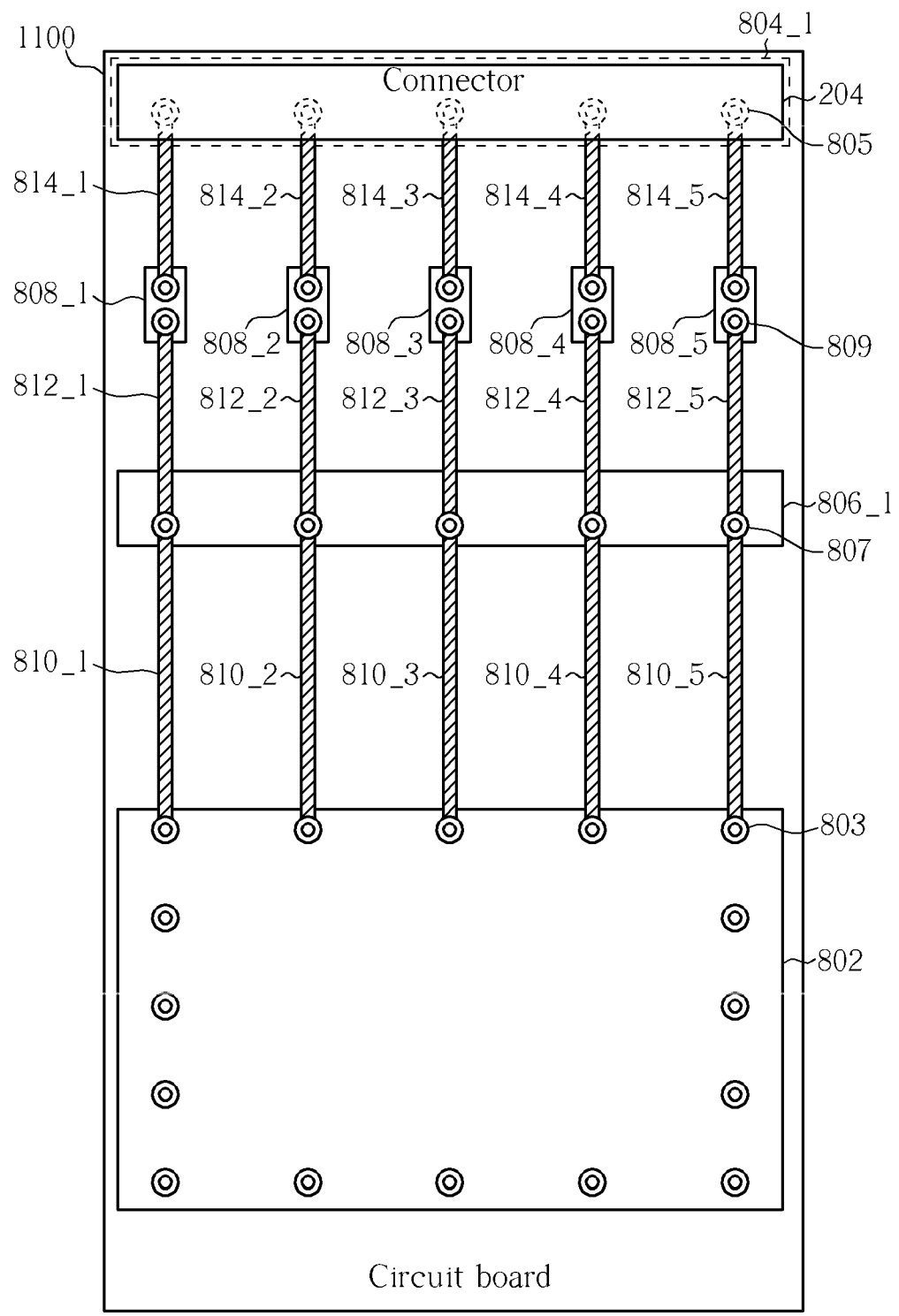
FIG. 11 is a block diagram illustrating a fifth exemplary layout design of a circuit board according to the present invention.

In above exemplary embodiments shown in FIG. 9 and FIG. 10, the first connector placement site 804_1 dedicated to the first signal processing circuit 212 is closer to the integrated circuit 202 than the second connector placement site 806_1 dedicated to the second signal processing circuit 214. However, this is for illustrative purposes only. In an alternative design, the second connector placement site 806_1 may be closer to the integrated circuit 202 than the first connector placement site 804_1. FIG. 11 is a block diagram illustrating a fifth exemplary layout design of a circuit board according to the present invention. The exemplary circuit board 1100 has a layout design similar to that of the exemplary circuit board 800 shown in FIG. 8. The major difference between them is that the second connector placement site 806_1 is closer to the integrated circuit placement site 802 than the first connector placement site 804_1.

Figure 12:
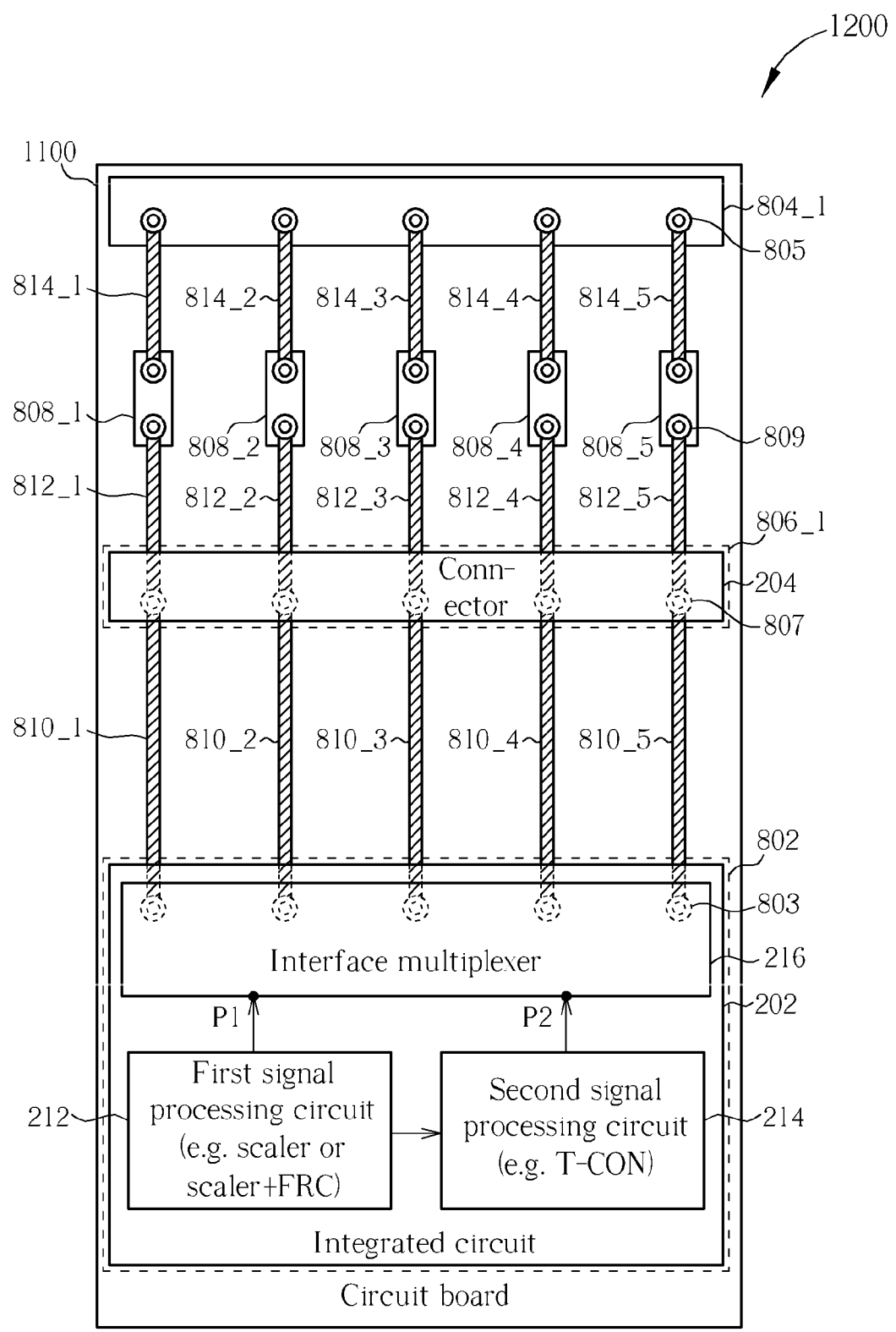
FIG. 12 is a block diagram illustrating a first exemplary electronic device employing the circuit board shown in FIG. 11 according to the present invention.
Figure 13:
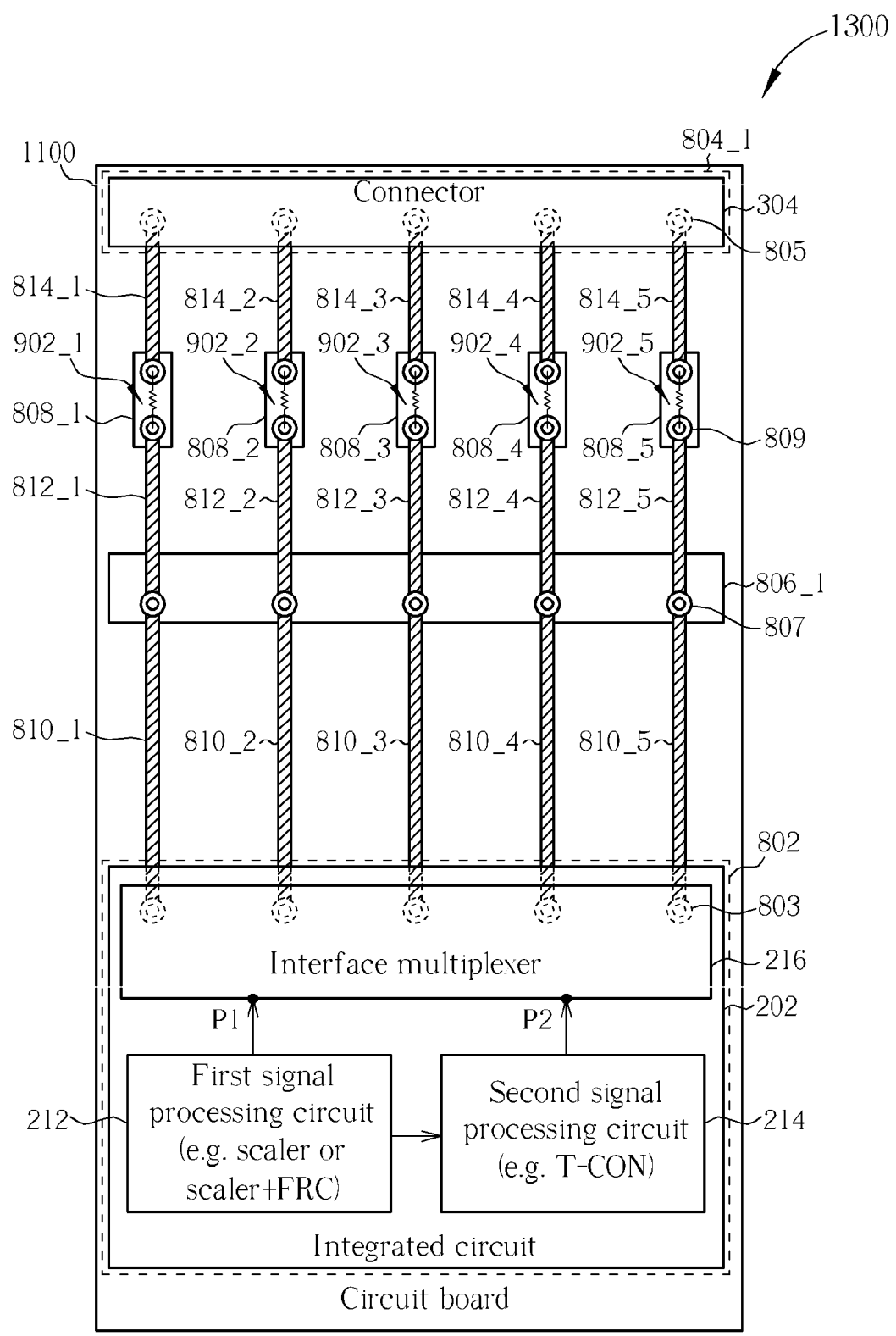
FIG. 13 is a block diagram illustrating a second exemplary electronic device employing the circuit board shown in FIG. 11 according to the present invention.

Please refer to FIG. 12 and FIG. 13 in conjunction with FIG. 11. FIG. 12 is a block diagram illustrating a first exemplary electronic device employing the circuit board 1100 shown in FIG. 11 according to the present invention. FIG. 13 is a block diagram illustrating a second exemplary electronic device employing the circuit board shown 1100 in FIG. 11 according to the present invention. In a case where a particular application employs the internal timing controller (i.e., the second signal processing circuit 214) implemented in the integrated circuit 202 for driving an external display panel, the interface multiplexer 216 of the exemplary electronic device 1200 would be controlled to have its output port electrically connected to the second port P2, and the connector 204 is installed on the second connector placement site 806_1 dedicated to the second processing circuit 214. In another case where a particular application employs an external timing controller, instead of the internal timing controller (i.e., the second signal processing circuit 214) implemented in the integrated circuit 202, for driving an external display panel, the interface multiplexer 216 of the exemplary electronic device 1300 would be controlled to have its output port electrically connected to the first port P1, and the connector 304 is installed on the first connector placement site 804_1 dedicated to the first signal processing circuit 212. Regarding the electronic device 1300 shown in FIG. 13, the passive component placement sites 808_1-808_5 have passive components 902_1-902_5 installed thereon, respectively. Regarding the electronic device 1200 shown in FIG. 12, the passive component placement sites 808_1-808_5 have no passive component installed thereon, thereby improving the signal transmission quality.

By way of example, but not limitation, the connector type and/or the interference tolerance may be taken into consideration when defining which one of the first connector placement site 804_1 and the second connector placement site 806_1 should be located closer to the integrated circuit placement site 802. Consider a case where one of the first connector placement site 804_1 and the second connector placement site 806_1 may be defined for allowing installation of an LVDS connector, and the other of the first connector placement site 804_1 and the second connector placement site 806_1 may be defined for allowing installation of a mini-LVDS connector. As the mini-LVDS connector is less resistant to interference, the connector placement site defined for allowing installation of a mini-LVDS connector would be closer to the integrated circuit placement site 802 than the connector placement site defined for allowing installation of an LVDS connector.

Consider another case where one of the first connector placement site 804_1 and the second connector placement site 806_1 may be defined for allowing installation of a first connector with a first connector shape, and the other of the first connector placement site 804_1 and the second connector placement site 806_1 may be defined for allowing installation of a second connector with a second connector shape. If installing the first connector on a connector placement site closer to the integrated circuit placement site 802 is easier than installing the first connector on a connector placement site far away from the integrated circuit placement site 802, the connector placement site defined for allowing installation of the first connector with the first connector shape would be closer to the integrated circuit placement site 802 than the connector placement site defined for allowing installation of the second connector with the second connector shape.

Figure 14:
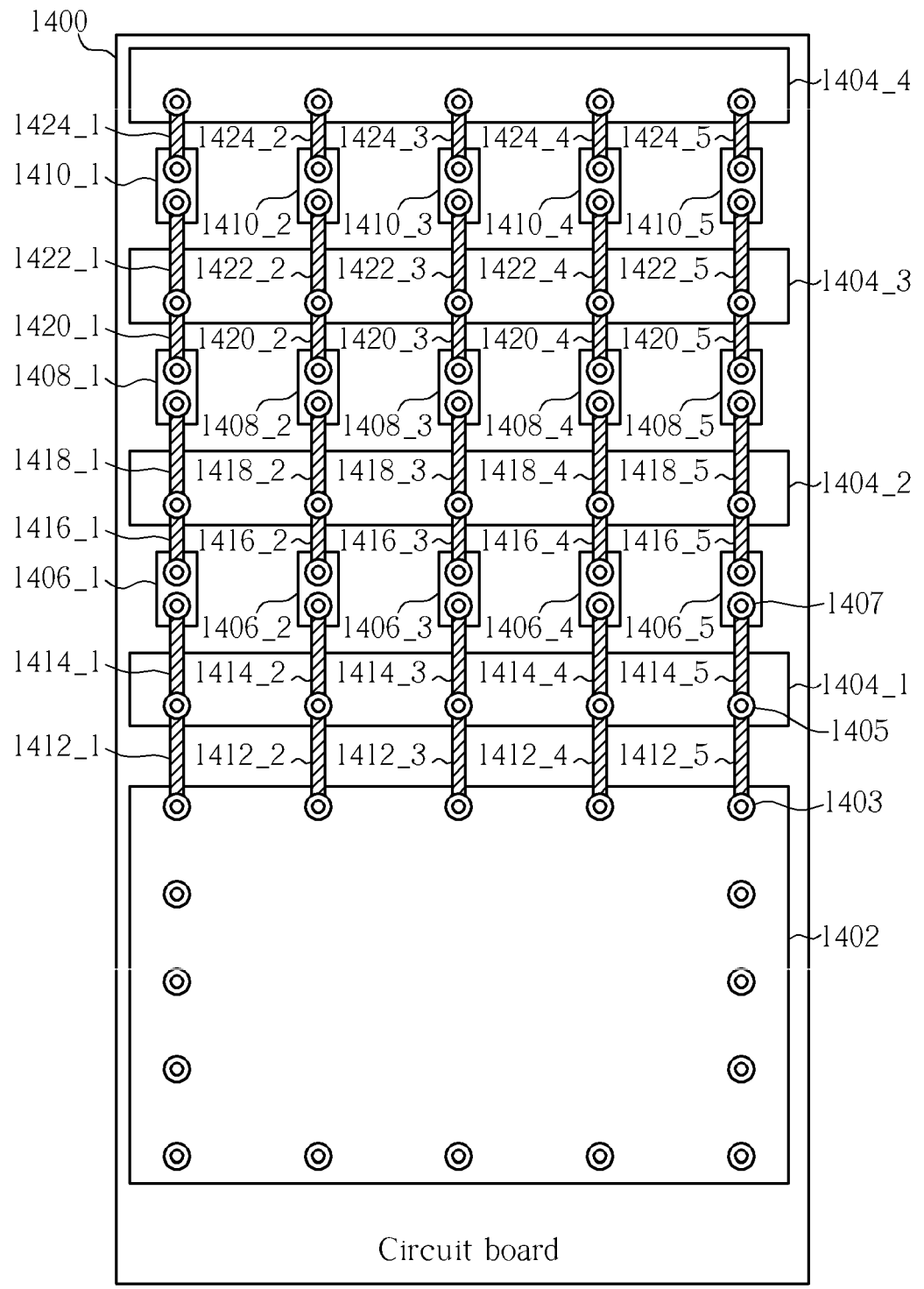
FIG. 14 is a block diagram illustrating a sixth exemplary layout design of a circuit board according to the present invention.

Regarding the layout design of each circuit board 800/1100, only one connector placement site dedicated to the first signal processing circuit 212 and only one connector placement site dedicated to the second signal processing circuit 214 are defined on the circuit board 800/1100. However, this is for illustrative purposes only, and is not meant to be a limitation of the present invention. FIG. 14 is a block diagram illustrating a sixth exemplary layout design of a circuit board according to the present invention. The circuit board (e.g., a printed circuit board) 1400 has an integrated circuit placement site 1402, a plurality of connector placement sites 1404_1-1404_4, a plurality of groups of passive component placement sites 1406-1-1406_5, 1408-1-1408_5, and 1410-1-1410_5, and a plurality of signal traces including first signal traces 1412_1-1412_5 electrically connected between the integrated circuit placement site 1402 and the connector placement site 1404_1, second signal traces 1414_1-1414_5 electrically connected between the connector placement site 1404_1 and passive component placement sites 1406_1-1406_5, third signal traces 1416_1-1416_5 electrically connected between the connector placement site 1404_2 and passive component placement sites 1406_1-1406_5, fourth signal traces 1418_1-1418_5 electrically connected between the connector placement site 1404_2 and passive component placement sites 1408_1-1408_5, fifth signal traces 1420_1-1420_5 electrically connected between the connector placement site 1404_3 and passive component placement sites 1408_1-1408_5, sixth signal traces 1422_1-1422_5 electrically connected between the connector placement site 1404_3 and passive component placement sites 1410_1-1410_5, and seventh signal traces 1424_1-1424_5 electrically connected between the connector placement site 1404_4 and passive component placement sites 1410_1-1410_5.

The integrated circuit placement site 1402 has a plurality of connection nodes 1403, such as pads or plated through holes (vias). Similarly, each of the connector placement sites 1404_1-1404_4 has a plurality of connection nodes 1405, such as plated through holes (vias), and each of the passive component placement sites 1406_1-1406_5, 1408_1-1408_5, and 1410_1-1410_5 has a plurality of connection nodes 1407, such as plated through holes (vias).

It should be noted that the connector placement sites 1404_1-1404_4 have more than one connector placement site dedicated to at least one of the first signal processing circuit 212 and the second signal processing circuit 214. By way of example, but not limitation, the connector placement sites 1404_1-1404_2 are both dedicated to the first signal processing circuit 212 but correspond to different connector types (i.e., different interface types), and the connector placement sites 1404_3-1404_4 are both dedicated to the second signal processing circuit 214 but correspond to different connector types (i.e., different interface types). In an alternative design, the connector placement sites 1404_1-1404_2 may be both dedicated to the second signal processing circuit 214 but correspond to different connector types, and the connector placement sites 1404_3-1404_4 may be both dedicated to the first signal processing circuit 212 but correspond to different connector types. In yet alternative design, one of the connector placement sites 1404_1-1404_4 is dedicated to one of the first signal processing circuit 212 and the second signal processing circuit 214, and the remaining connector placement sites are all dedicated to the other of the first signal processing circuit 212 and the second signal processing circuit 214 but correspond to different connector types.

Moreover, as a person skilled in the art can readily understand details of exemplary electronic devices each employing the circuit board 1400 shown in FIG. 14 after reading the above paragraphs directed to the exemplary electronic devices 900, 1000, 1200, and 1300, further description is omitted here for brevity.

It should be noted that the connector placement sites defined on the same circuit board may correspond to different connector types. It is possible that connectors with different connector types may have different numbers of connection pins. In order to make connector placement sites on the circuit board layout design successfully support different connector types through only signal traces as shown in FIG. 1, FIG. 4 and FIG. 7 or a combination of signal traces and passive component placement sites as shown in FIG. 8, FIG. 11, and FIG. 14, each of the connector placement sites may be configured to have the number of connection nodes equal to a maximum value among the connection pin numbers of all supported connector types. To put it simply, part or all of the connection nodes defined in a connector placement site may be used for actual signal transmission, depending upon a connector type of a connector installed on the connector placement site.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device, comprising:
    an integrated circuit, comprising:
        a first signal processing circuit;
        a second signal processing circuit; and
        an interface multiplexer, having a first input port electrically connected to the first signal processing circuit, a second input port electrically connected to the second signal processing circuit, and an output port electrically connected to the first input port or the second input port;
    a circuit board, carrying the integrated circuit and comprising:
        a plurality of connector placement sites, including at least a first connector placement site and at least a second connector placement site, wherein the connector placement sites and the output port of the interface multiplexer are electrically connected in series; and
    a connector, installed on one of the connector placement sites, wherein when the connector is installed on the first connector placement site, the connector outputs signals from the first signal processing circuit, and when the connector is installed on the second connector placement site, the connector outputs signals from the second signal processing circuit,
    wherein the first signal processing circuit is a video processing circuit, and the second signal processing circuit is a timing controller.

2. The electronic device of claim 1, wherein the output port is electrically connected to the first input port, the connector is installed on the first connector placement site, and the second connector placement site has no connector installed thereon.

3. The electronic device of claim 1, wherein the connector placement sites includes a plurality of first connector placement sites, the output port is electrically connected to the first input port, the connector is installed on one of the first connector placement sites, and each remaining first connector placement site and the second connector placement site have no connector installed thereon.

4. The electronic device of claim 1, wherein the first connector placement site is closer to the integrated circuit than the second connector placement site.

5. The electronic device of claim 1, wherein the second connector placement site is closer to the integrated circuit than the first connector placement site.

6. The electronic device of claim 1, wherein the circuit board further comprises:
   a plurality of signal traces, including first signal traces electrically connected between the first connector placement site and the output port of the interface multiplexer and second signal traces electrically connected between the first connector placement site and the second connector placement site, wherein the output port of the interface multiplexer, the first connector placement site, and the second connector placement site are electrically connected in series through the first signal traces and the second signal traces.

7. The electronic device of claim 1, wherein the circuit board further comprises:
   a group of passive component placement sites, disposed between the first connector placement site and the second connector placement site; and
   a plurality of signal traces, including first signal traces electrically connected between the output port of the interface multiplexer and the first connector placement site, second signal traces electrically connected between the first connector placement site and the group of passive component placement sites, and third signal traces electrically connected between the second connector placement site and the group of passive component placement sites; and
   the electronic device further comprises a plurality of passive components installed on the passive component placement sites, respectively, and the output port of the interface multiplexer, the first connector placement site, and the second connector placement site are electrically connected in series through the passive components and the first, second, and third signal traces.

8. The electronic device of claim 7, wherein each of the passive components is a zero-ohm resistor.

* * * * *